United States Patent [19]
Hopper

[11] Patent Number: 6,121,096
[45] Date of Patent: Sep. 19, 2000

[54] IMPLANT PROCESS UTILIZING AS AN IMPLANT MASK, SPACERS PROJECTING VERTICALLY BEYOND A PATTERNED POLYSILICON GATE LAYER

[75] Inventor: Peter J. Hopper, San Jose, Calif.

[73] Assignee: National Semiconductor Corporation, Santa Clara, Calif.

[21] Appl. No.: 09/270,704

[22] Filed: Mar. 17, 1999

[51] Int. Cl.$^7$ .............................................. H01L 21/8238
[52] U.S. Cl. ...................... 438/290; 438/217; 438/289; 438/291; 438/525
[58] Field of Search .................................. 438/289, 290, 438/291, 585

[56] References Cited

U.S. PATENT DOCUMENTS

| | | | |
|---|---|---|---|
| 5,395,773 | 3/1995 | Ravindhran | 438/217 |
| 5,474,947 | 12/1995 | Chang et al. | 438/257 |
| 5,496,750 | 3/1996 | Moslehi | 437/41 |
| 5,514,609 | 5/1996 | Chen et al. | 437/45 |
| 5,770,506 | 6/1998 | Koh | 438/303 |
| 5,891,784 | 4/1999 | Cheung et al. | 438/308 |
| 5,981,346 | 11/1999 | Hopper | 438/304 |

*Primary Examiner*—Charles Bowers
*Assistant Examiner*—William M. Brewster
*Attorney, Agent, or Firm*—Limbach & Limbach LLP

[57] ABSTRACT

A process for forming implanted regions at an optimal location in a semiconductor substrate underneath a patterned polysilicon gate of an MOS transistor. The process includes steps of first providing a semiconductor substrate (e.g. a silicon wafer) with a gate oxide layer on its surface, followed by the formation of a polysilicon gate layer on the gate oxide layer. An additional oxide layer is subsequently formed on the polysilicon gate layer. The resulting structure is then patterned to form a patterned additional oxide layer and a patterned polysilicon gate layer, all of which are subsequently covered by a conformal silicon nitride layer. Next, the conformal silicon nitride layer is anisotropically etched to form spacers on the sidewalls of the patterned structure. After removal of the patterned additional oxide layer, leaving the spacers projecting above the patterned polysilicon gate layer, dopant atoms are implanted through the patterned polysilicon gate layer and into the semiconductor substrate using the spacers as an implant mask. By the proper selection of spacer dimensions, implant energy and implant angle, the portion of the implanted region with the highest dopant atom concentration can be placed at the optimum location (e.g. the lateral edges of LDD extension regions in a channel region and the interface between the gate oxide layer and the channel region). The implanted region then serves as a halo implant region to suppress the drain-induced barrier lowering effect without extensive counterdoping of the LDD extension regions or the creation of parasitic junction capacitance.

9 Claims, 4 Drawing Sheets

IMPLANT PROCESS UTILIZING AS AN IMPLANT MASK, SPACERS PROJECTING VERTICALLY BEYOND A PATTERNED POLYSILICON GATE LAYER

BACKGROUND OF THE INVENTION

1. Field of the Invention

The present invention relates to semiconductor device fabrication and, in particular, to processes for forming implanted regions during semiconductor device fabrication.

2. Description of the Related Art

The fabrication of semiconductor devices often involves the processing of a semiconductor substrate (e.g. a silicon wafer) through a series of steps. Typically, this series of steps includes multiple ion implantation processes during which dopant atoms are introduced into and beyond the surface of the semiconductor substrate. The dopant atoms are added to the semiconductor substrate to form various semiconductor device regions, such as well regions, source and drain regions, and Lightly Doped Drain (LDD) extension regions. The dopant atoms are also added to modify the electrical characteristics of the semiconductor device, as in the case of Threshold Voltage ($V_T$) adjust implants. See S. Wolf and R. N. Tauber, *Silicon Processing for the VLSI Era, Volume 1—Process Technology,* 280–283 (Lattice Press 1986), which is hereby incorporated by reference, for a further discussion of ion implantation processes.

Referring to FIG. 1, a representative conventional MOS transistor structure is illustrated. The MOS transistor structure 10 includes a gate oxide layer 12 overlying P-type semiconductor substrate 14 between N-type LDD source extension region 16 and N-type LDD drain extension region 18. The N-type LDD source extension region 16 extends from an N-type source region 28 in the P-type semiconductor substrate, while the N-type LDD drain extension region 18 extends from an N-type drain region 30. Channel region 20 is located in the P-type semiconductor substrate 14 between the N-type LDD source extension region 16 and the N-type LDD drain extension region 18. A patterned polysilicon gate layer 22 overlies the gate oxide layer 12. Gate sidewall spacers 24 and 26 are formed on the sidewalls of patterned polysilicon gate layer 22 and gate oxide layer 12. The gate sidewall spacers 24 and 26 are typically formed of silicon dioxide or silicon nitride. In MOS transistors with short channel lengths, namely those with channel lengths of less than 0.5 microns, specialized "halo" implant processes are frequently employed to introduce dopant atoms under the N-type LDD source extension region 16 and the N-type LDD drain extension region 18, in order to suppress the Drain-Induced Barrier Lowering (DIBL) effect. The result of such "halo" implant processes is the creation of a halo implant region, such as P-type halo implant region 32, where the P-type doping level is significantly higher than in the surrounding P-type semiconductor substrate.

Halo implant processes are conventionally conducted after the patterned polysilicon gate layer has been formed, but before the formation of the gate sidewall spacers, and therefore employ a high implant angle in order to place the dopant atoms well beneath the patterned polysilicon gate layer. See, S. Wolf, *Silicon Processing for the VLSI Era, Volume 3—The Submicron MOSFET,* 232–240, 309–311, 621–622 (Lattice Press 1995), which is hereby incorporated by reference, for a further discussion of halo implant processes. A drawback of conventional halo implant processes is that the implanted dopant atoms are not directly positioned at the optimum location in the semiconductor substrate (i.e. at the lateral edge of the LDD source and drain extension regions in the channel region, as well as at the interface between the gate oxide layer and the channel region) due to blocking (i.e. "shadowing") of the dopant atoms by the patterned polysilicon gate layer. This drawback is typically addressed by implanting a relatively large dose of dopant atoms, while relying on diffusion and scattering to position at least some of the dopant atoms at the optimum location. Such an approach, however, leads to (i) extensive counterdoping of the LDD source and drain extension regions, (ii) degradation of carrier mobility due to dopant atom induced scattering, and (iii) parasitic junction capacitance (i.e. vertical capacitance) between the LDD source and drain extension regions and the halo implant region.

There is, therefore, still a need in the art for a process that provides for the creation of implanted regions at optimum locations underneath a patterned polysilicon gate layer.

SUMMARY OF THE INVENTION

The present invention provides a process for forming implanted regions at optimal locations underneath a patterned polysilicon gate layer of an MOS transistor. Processes in accordance with the present invention include steps of first providing a semiconductor substrate (e.g. a silicon wafer) with a gate oxide layer on its surface, followed by the formation of a polysilicon gate layer (e.g. 100 angstroms to 500 angstroms in thickness) on the gate oxide layer. An additional oxide layer is subsequently formed on the polysilicon gate layer. The combination of an additional oxide layer and an underlying polysilicon gate layer constitutes an oxide/polysilicon stack. The oxide/polysilicon stack is then patterned to form a patterned oxide/polysilicon stack layer that includes both a patterned additional oxide layer and a patterned polysilicon gate layer. The patterning of the oxide/polysilicon stack also exposes portions of the gate oxide layer. Next, a conformal silicon nitride layer is deposited over the patterned oxide/polysilicon stack layer and the exposed portions of the gate oxide layer. This conformal silicon nitride layer is then etched (e.g. by an anisotropic etch) to form silicon nitride spacers on the sidewalls of the patterned oxide/polysilicon stack layer. Next, the patterned additional oxide layer is removed to leave the silicon nitride spacers extending above the patterned polysilicon gate layer. Dopant atoms of the same conductivity type as the semiconductor substrate are then implanted (e.g. at an angle in the range of 5 degrees to 50 degrees measured from the perpendicular to the semiconductor substrate surface, and an energy of from 25 KeV to 60 KeV), through the patterned polysilicon gate layer, into optimum predetermined regions of the semiconductor substrate using the silicon nitride spacers as an implant mask. The result is an implanted region underneath the patterned polysilicon gate layer.

By the proper selection of silicon nitride spacer width and height (namely the extent to which the silicon nitride spacers vertically project beyond the patterned polysilicon gate layer), implant energy and implant angle, the portion of the implanted region with the highest dopant atom concentration can be controllably placed at the optimum location. Such an optimum location includes, for example, the lateral edge of the LDD source and drain extension regions in the channel region, as well as the interface between the gate oxide layer and the channel region. The implanted region can serve as a halo implant region that suppresses the Drain-Induced Barrier Lowering (DIBL) effect in the MOS transistor without (i) extensive counterdoping of the LDD source and drain extension regions, (ii) significant degradation of carrier mobility due to dopant atom induced scattering, or (iii) the creation of parasitic junction capacitance (i.e. vertical capacitance) between the LDD source and drain extension regions and the halo implant region.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

In order to provide a clear and consistent understanding of the present invention and claims, the following definitions are hereby provided:

The terms "dopant" and "dopants" refer to donor and acceptor impurity atoms, such as N-type phosphorous (P), N-type arsenic (As), P-type boron (B) and P-type indium (In), which are intentionally introduced into a semiconductor substrate (e.g. a silicon wafer) in order to change the charge-carrier concentration of the semiconductor substrate. See, R. S. Muller and T. I. Kamins, *Device Electronics for Integrated Circuits 2nd Edition*, 11–14 (John Wiley and Sons 1986) for a further description of dopants.

The term "oxide layer" refers to single-layered silicon dioxide ($SiO_2$), as well as to multi-layered silicon dioxide (i.e. oxide "stacks"), both regardless of the presence of dopants or other additives. The term, therefore, includes: (i) silicon dioxide layers formed by the decomposition of tetraethyl-orthosilicate (TEOS, $Si[OC_2H_5]_4$); (ii) silicon dioxide layers resulting from the reaction of silane ($SiH_4$) or dichlorosilane ($SiCl_2H_2$); (iii) phosphosilicate glass (PSG) layers; and (iv) other $SiO_2$ based layers known in the field.

The term "conformal," when used in reference to a layer, means that the layer is formed on a substrate in such a manner that the thickness of the layer is essentially identical over any substrate surface topography. Therefore, when a conformal layer is formed over a patterned layer, the thickness of the conformal layer is identical on both the vertical and horizontal surfaces of the underlying patterned layer. See S. Wolf and R. N. Tauber, *Silicon Processing for the VLSI Era, Volume 1—Process Technology*, 185 (Lattice Press 1986), which is hereby incorporated by reference, for a further discussion of the term "conformal".

Figure 1:
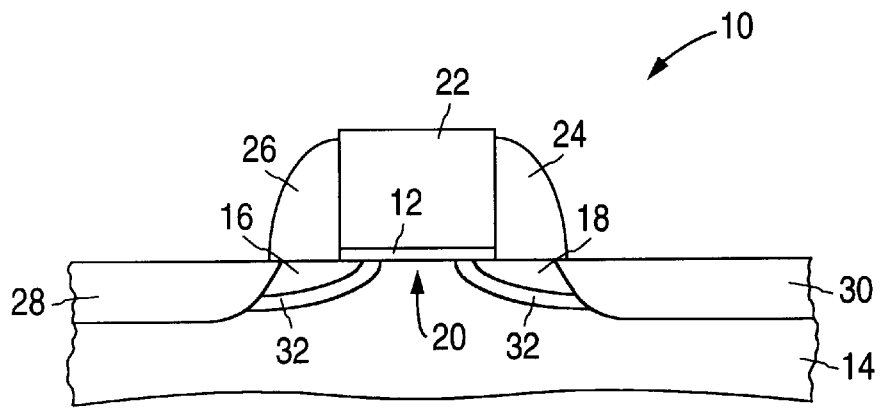
FIG. 1 is a cross-sectional view of a MOS transistor structure including LDD source and drain extension regions and a conventional halo implant region.
Figure 2:
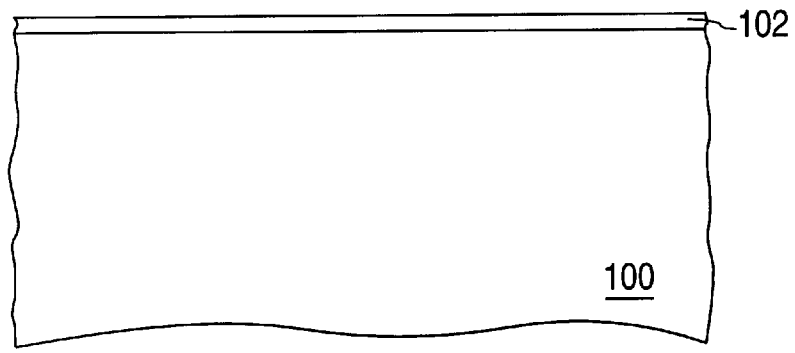
FIGS. 2–10 are cross-sectional views illustrating stages in a process in accordance with the present invention.
Figure 3:
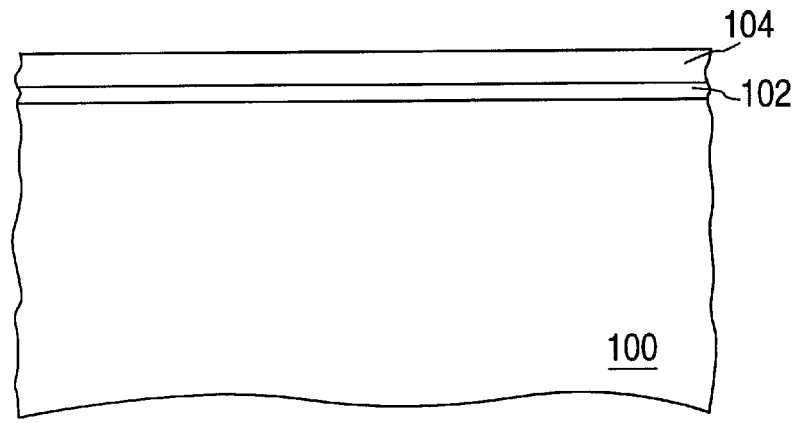

FIGS. 2–10 illustrate stages in a process in accordance with the present invention wherein the implanted region formed thereby is a halo implant region. It will be understood by one of ordinary skill in the art, however, that a process according to the present invention can be also utilized for the formation of various other implanted regions. First, a semiconductor substrate 100 (e.g. a silicon wafer) with a gate oxide layer 102 on its surface is provided, as illustrated in FIG. 2. Gate oxide layer 102 is typically a thermally grown $SiO_2$ layer of less than 100 angstroms in thickness. A polysilicon gate layer 104 is then deposited on the gate oxide layer 102 using standard techniques well known in the field, such as Low Pressure Chemical Vapor Deposition (LPCVD). The polysilicon gate layer 104 has a typical thickness in the range of 100 to 500 angstroms. The resulting structure is shown in FIG. 3.

Figure 4:
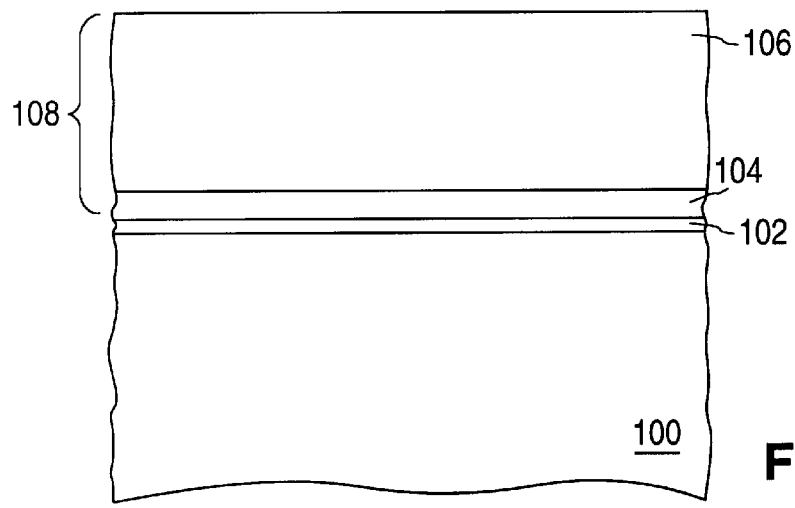

Next, an additional oxide layer 106 is deposited on the polysilicon gate layer 104, as illustrated in FIG. 4, by conventional means that are known to those of skill in the field, such as LPCVD or plasma-enhanced CVD (PECVD). The combination of the additional oxide layer 106 and the immediately underlying polysilicon gate layer 104 is referred to as an oxide/polysilicon stack 108. The additional oxide layer 106 has a typical thickness in the range of 1000 angstroms to 3000 angstroms. Although TEOS-based oxides, silane-based oxides, PSG and other silicon dioxides ($SiO_2$) known in the field can be employed as the additional oxide layer 106, PSG is preferred due to its high etch selectivity versus both polysilicon and undoped thermally grown $SiO_2$.

Figure 5:
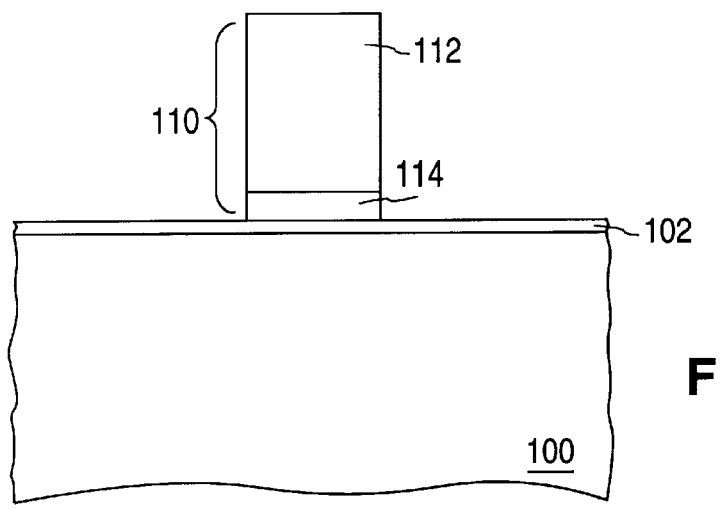

Next, the oxide/polysilicon stack 108 is patterned to form a patterned oxide/polysilicon stack layer 110, exposing portions of the gate oxide layer 102. The resulting structure is illustrated in FIG. 5. The patterned oxide/polysilicon stack layer 110 includes a patterned additional oxide layer 112 and a patterned polysilicon gate layer 114. This patterning step can be accomplished by, for example, an anisotropic oxide etch and an anisotropic polysilicon etch that stops on the gate oxide layer 102, using a patterned photoresist layer as an etch mask.

Figure 6:
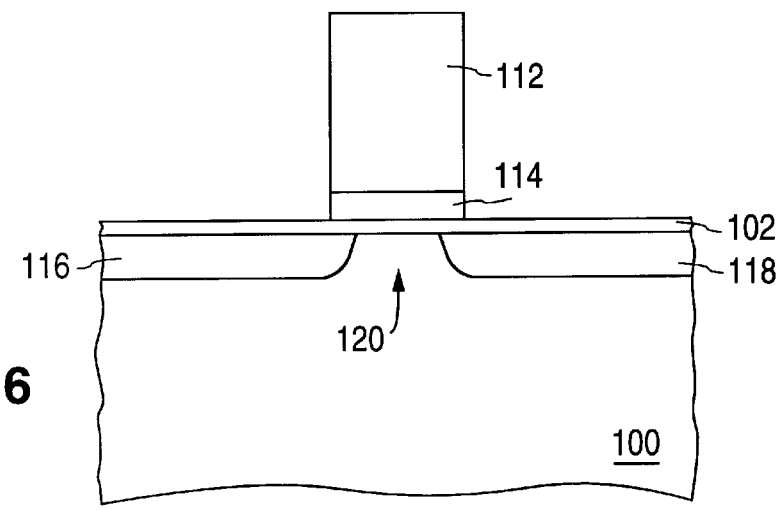

Next, LDD source extension region 116 and LDD drain extension region 118 are optionally formed in the conventional manner via ion implantation. Typical NMOS transistor LDD implant parameters include phosphorous (P) or arsenic (As) as the dopant atoms, an implant energy of from 5 KeV to 50 KeV, an implant angle of from 0 degrees to 70 degrees, and an implant dose in the range of 1E13 ions/$cm^2$ to 1E15 ions/$cm^2$. Typical PMOS transistor LDD implant parameters are identical to those for an NMOS transistor, except for the dopant atoms being either boron (B), $BF_2$, or indium (In). In an MOS transistor, the semiconductor substrate region between the LDD source extension region 116 and the LDD drain extension region 118 is known as the channel region 120. The resulting structure is illustrated in FIG. 6.

Figure 7:
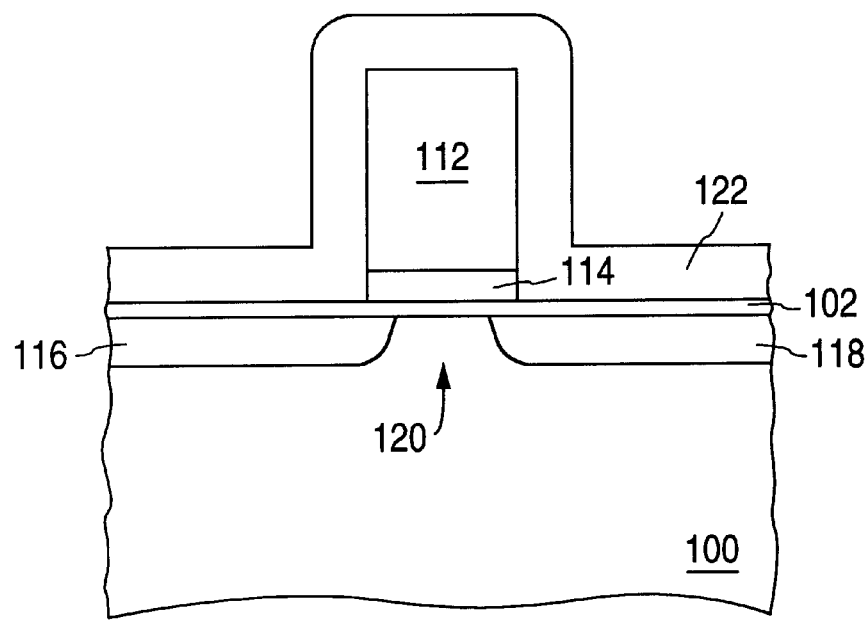
Figure 8:
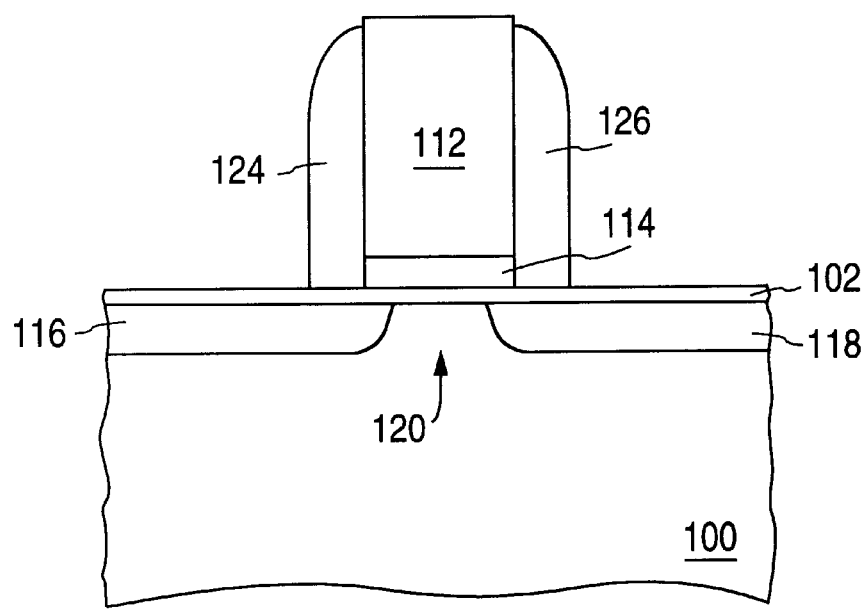
Figure 9:
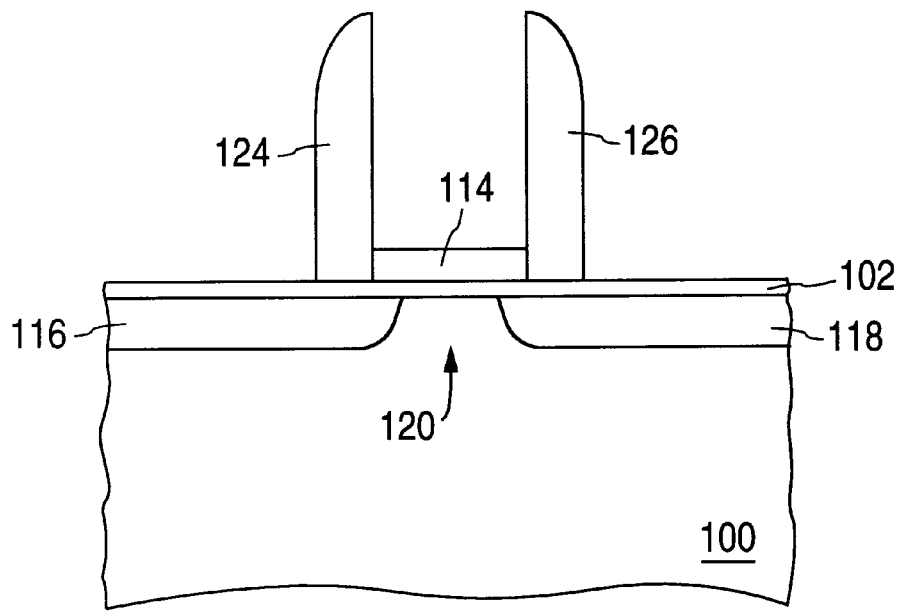

Next, a conformal silicon nitride layer ($Si_3N_4$) 122 is formed covering the patterned oxide/polysilicon stack layer 110 and the exposed portions of the gate oxide layer 102, as illustrated in FIG. 7. A typical conformal silicon nitride layer has a thickness in the range of 400 angstroms to 1500 angstroms (0.04 microns to 0.15 microns). Conformal silicon nitride layers can be deposited using either conventional LPCVD or PECVD techniques. The conformal silicon nitride layer 122 is subsequently anisotropically etched to form silicon nitride spacers 124 and 126 on the sidewalls of the patterned oxide/polysilicon stack layer 110. Due to the anisotropic nature of the etch (i.e. a primarily vertical etch), the width of the silicon nitride spacers is essentially the same as the thickness of the conformal silicon nitride layer 122. The resulting structure is shown in FIG. 8. The patterned additional oxide layer 112 is then removed, for example by a plasma etch technique, leaving the silicon nitride spacers 124 and 126 extending above the patterned polysilicon gate layer 114. The resulting structure is illustrated in FIG. 9.

Figure 10:
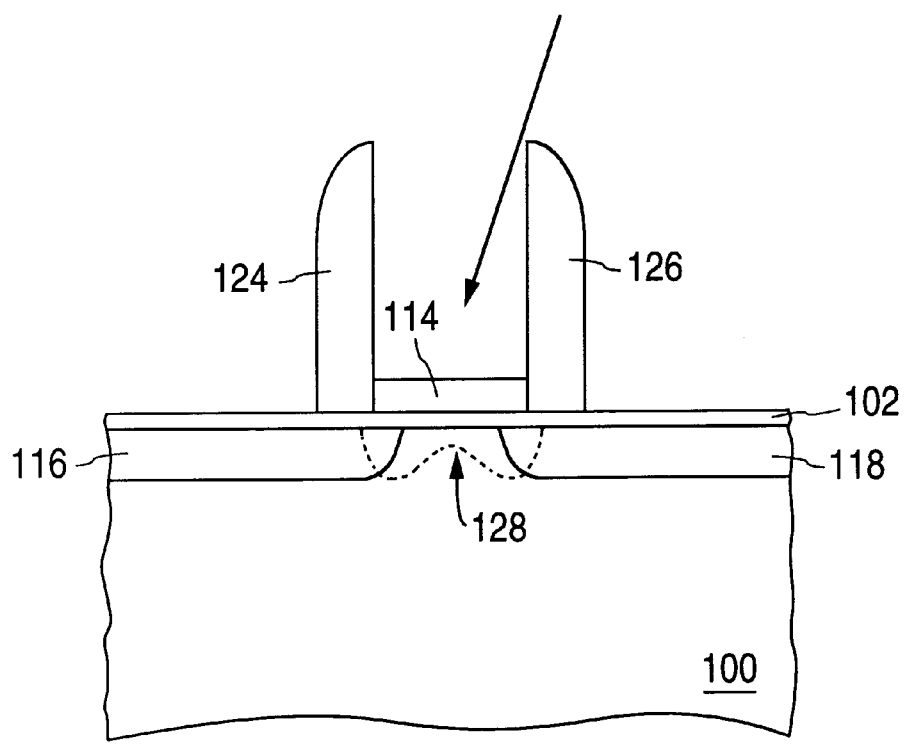

Next, in a process step referred to as an "inside angled halo implant," dopant atoms of the same conductivity type as the semiconductor substrate are implanted through the patterned polysilicon gate layer 114 and into the channel region 120, in order to form a halo implanted region 128, as shown in FIG. 10. The name of this process step, "inside angled halo implant" step, originates from the fact that the dopant atoms are implanted at an angle into the channel region after traveling between (i.e. "inside") the silicon nitride spacers 124 and 126 (see FIG. 10, where the arrow indicates a direction of travel for the dopant atoms during implantation). The inside angled halo implant process step conditions depend on the patterned polysilicon gate layer thickness, the desired location for the halo implant region in the semiconductor substrate, and the silicon nitride spacer width and height (namely the extent to which the silicon nitride spacers vertically project beyond the patterned polysilicon gate layer). The inside angled halo implant process step would, however, typically be conducted at an implant angle in the range of 5 degrees to 50 degrees, implant energy in the range of 25 KeV to 60 KeV, and an implant dose in the range of 1E12 ions/cm$^2$ to 1E14 ions/cm$^2$.

The process according to the present invention provides for the highest concentration of implanted dopant atoms to be placed at the optimum location. Such placement can be used to suppress the DIBL effect when the optimum location is at, for example, the lateral edge of the LDD source and drain extension regions 116 and 118 in the channel region, as well as the interface between the gate oxide layer 102 and the channel region 120, without resorting to the conventional halo implant processes that lead to extensive counterdoping of the LDD source and drain extension regions. The absence of extensive counterdoping improves transistor performance by reducing the amount of dopant atom induced scattering, thereby curtailing the extent of carrier mobility degradation. Furthermore, since the introduction of high concentrations of dopant atoms under the LDD source and drain extension regions is prevented by the use of vertically projecting silicon nitride spacers as an implant mask in processes according to the present invention, parasitic junction capacitance (i.e. vertical capacitance between the LDD source and drain extension regions and the halo implant region) is reduced in comparison to conventional processes.

It should be understood that various alternatives to the embodiments of the invention described herein may be employed in practicing the invention. For example, while specific dimensions, implant doses, implant energies, and implant angles have been set forth to illustrate the invention, they are not intended to limit the invention. It is intended that the following claims define the scope of the invention and that processes within the scope of these claims and their equivalents be covered thereby.

What is claimed is:

1. A method for the formation of an implanted region for use in an MOS transistor, the method comprising the steps of:

providing a semiconductor substrate with a gate oxide layer thereon;

forming a polysilicon gate layer on the gate oxide layer;

forming an additional oxide layer on the polysilicon gate layer, thereby forming an oxide/polysilicon stack;

patterning the oxide/polysilicon stack to form a patterned oxide/polysilicon stack layer that includes a patterned additional oxide layer overlying a patterned polysilicon gate layer, and to expose portions of the gate oxide layer;

forming a conformal silicon nitride layer over the patterned oxide/polysilicon stack layer and the exposed portions of the gate oxide layer;

etching the conformal silicon nitride layer to form silicon nitride spacers on sidewalls of the patterned oxide/polysilicon stack layer;

removing the patterned additional oxide layer leaving the silicon nitride spacers extending above the patterned polysilicon gate layer; and implanting dopant atoms at an angle from the perpendicular to the surface of the semiconductor substrate in the range of from 5 degrees to 50 degrees, through the patterned polysilicon gate layer, into a predetermined region of the semiconductor substrate to create an implanted region while using the silicon nitride spacers as an implant mask.

2. The method of claim 1 wherein the step of forming a polysilicon gate layer includes forming a polysilicon gate layer with a thickness in the range of 100 angstroms to 500 angstroms, and wherein the implanting step includes implanting dopant atoms at an energy in the range of 25 KeV to 60 KeV.

3. The method of claim 1 wherein the implanting step includes implanting dopant atoms to form a halo implant region that suppresses drain-induced barrier lowering in the MOS transistor.

4. The method of claim 1 further including the step of:

implanting LDD dopant atoms into the semiconductor substrate using the patterned oxide/polysilicon stack layer as an implant mask, after the patterning step and before the step of forming a conformal silicon nitride layer, and wherein the implanted LDD dopant atoms form a LDD source extension region and a LDD drain extension region, each with a lateral edge located under the patterned polysilicon gate layer, thereby defining a channel region therebetween.

5. The method of claim 4 wherein the implanting step includes implanting dopant atoms to create an implanted region at the lateral edges of the LDD source extension region and the LDD drain extension region.

6. The method of claim 1 wherein the step of forming an additional oxide layer includes forming an additional oxide layer selected from the group consisting of a phosposilicate glass (PSG) layer, a tetraethylorthosilicate-based (TEOS-based) oxide layer, and a silane-based oxide layer.

7. The method of claim 6 wherein the step of forming an additional oxide layer includes forming a phosposilicate glass (PSG) layer with a thickness in the range of 1000 angstroms to 3000 angstroms.

8. A method for the formation of an implanted region for use in an MOS transistor, the method comprising the steps of:

providing a semiconductor substrate with a gate oxide layer thereon;

forming a polysilicon gate layer on the gate oxide layer;

forming an additional oxide layer on the surface of the polysilicon gate layer, thereby forming an oxide/polysilicon stack;

patterning the oxide/polysilicon stack to form a patterned oxide/polysilicon stack layer that includes a patterned additional oxide layer overlying a patterned polysilicon gate layer, and to expose portions of the gate oxide layer;

implanting LDD dopant atoms into the semiconductor substrate using the patterned oxide/polysilicon stack layer as an implant mask to create a LDD source extension region and a LDD drain extension region, each with a lateral edge located under the patterned polysilicon gate layer, thereby defining a channel region therebetween;

forming a conformal silicon nitride layer over the patterned oxide/polysilicon stack layer and the exposed portions of the gate oxide layer;

etching the conformal silicon nitride layer to form silicon nitride spacers on sidewalls of the patterned oxide/polysilicon stack layer;

removing the patterned additional oxide layer leaving the silicon nitride spacers extending above the patterned polysilicon gate layer;

implanting dopant atoms at an angle from the perpendicular to the surface of the semiconductor substrate in the range of from 5 degrees to 50 degrees, through the patterned polysilicon gate layer, into a predetermined region of the channel region to create an implanted region while using the silicon nitride spacers as an implant mask.

9. The method of claim 8 wherein the step of implanting dopant includes creating a halo implant region that suppresses drain-induced barrier lowering in the MOS transistor.

* * * * *